(12) United States Patent
Wostyn et al.

(10) Patent No.: US 10,361,268 B2
(45) Date of Patent: Jul. 23, 2019

(54) INTERNAL SPACERS FOR NANOWIRE SEMICONDUCTOR DEVICES

(71) Applicant: IMEC VZW, Leuven (BE)

(72) Inventors: Kurt Wostyn, Lubbeek (BE); Hans Mertens, Leuven (BE); Liesbeth Witters, Lubbeek (BE); Andriy Hikavyy, Haasrode (BE); Naoto Horiguchi, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/907,878

(22) Filed: Feb. 28, 2018

(65) Prior Publication Data

US 2018/0254321 A1    Sep. 6, 2018

(30) Foreign Application Priority Data

Mar. 3, 2017  (EP) ..................................... 17159054

(51) Int. Cl.
*H01L 29/06* (2006.01)
*H01L 29/66* (2006.01)
*B82Y 40/00* (2011.01)
*H01L 21/8234* (2006.01)
(Continued)

(52) U.S. Cl.
CPC .......... *H01L 29/0653* (2013.01); *B82Y 10/00* (2013.01); *B82Y 40/00* (2013.01);
(Continued)

(58) Field of Classification Search
CPC ....... B82Y 40/00; B82Y 10/00; H01L 29/775; H01L 29/66439; H01L 29/41725;
(Continued)

(56) References Cited

U.S. PATENT DOCUMENTS 8,785,981 B1    7/2014  Chang et al.
9,276,064 B1    3/2016  Zang et al.
(Continued)

OTHER PUBLICATIONS

Yang, Ruipeng et al., "Advanced in situ Pre-Ni Silicide (Silconi) Cleaning at 65 nm to Resolve Defects in NiSi x Modules", Journal of Vacuum Science & Technology B, vol. 28(1), Jan./Feb. 2010, pp. 56-61.

(Continued)

*Primary Examiner* — Allen L Parker
*Assistant Examiner* — Gustavo G Ramallo
(74) *Attorney, Agent, or Firm* — McDonnell Boehnen Hulbert & Berghoff LLP

(57) ABSTRACT

A method of forming an internal spacer between nanowires, the method involving: providing a fin comprising a stack of layers of sacrificial material alternated with nanowire material, and selectively removing part of the sacrificial material, thereby forming a recess. The method also involves depositing dielectric material into the recess resulting in dielectric material within the recess and excess dielectric material outside the recess, where a crevice remains in the dielectric material in each recess, and removing the excess dielectric material using a first etchant. The method also involves enlarging the crevices to form a gap using a second etchant such that a remaining dielectric material still covers the sacrificial material and partly covers the nanowire material, and such that outer ends of the nanowire material are accessible; and growing electrode material on the outer ends such that the electrode material from neighboring outer ends merge, thereby covering the gap.

17 Claims, 5 Drawing Sheets

(51) Int. Cl.
*H01L 29/08* (2006.01)
*B82Y 10/00* (2011.01)
*H01L 29/417* (2006.01)
*H01L 29/775* (2006.01)
*H01L 21/311* (2006.01)

(52) U.S. Cl.
CPC .. *H01L 21/823425* (2013.01); *H01L 29/0669* (2013.01); *H01L 29/0673* (2013.01); *H01L 29/0847* (2013.01); *H01L 29/41725* (2013.01); *H01L 29/6653* (2013.01); *H01L 29/6681* (2013.01); *H01L 29/66439* (2013.01); *H01L 29/66545* (2013.01); *H01L 29/66553* (2013.01); *H01L 29/775* (2013.01); *H01L 21/31111* (2013.01); *H01L 21/31116* (2013.01)

(58) Field of Classification Search
CPC ........... H01L 29/66545; H01L 29/6653; H01L 29/6681; H01L 29/66553; H01L 29/0673; H01L 29/0847; H01L 21/823425; H01L 29/0669
See application file for complete search history.

(56) References Cited

U.S. PATENT DOCUMENTS

| | | | |
|---|---|---|---|
| 9,362,355 | B1 | 6/2016 | Cheng et al. |
| 9,419,102 | B1* | 8/2016 | Leobandung ....... H01L 29/6656 |
| 9,805,988 | B1* | 10/2017 | Bentley ........... H01L 21/823807 |
| 2012/0007051 | A1 | 1/2012 | Bangsaruntip et al. |
| 2013/0341704 | A1* | 12/2013 | Rachmady ........ H01L 29/66545 257/327 |
| 2015/0179755 | A1* | 6/2015 | Rooyackers ...... H01L 29/42392 257/24 |
| 2015/0372115 | A1 | 12/2015 | Koh et al. |
| 2016/0172358 | A1 | 6/2016 | Hatcher et al. |
| 2017/0110554 | A1 | 4/2017 | Tak et al. |
| 2018/0331180 | A1* | 11/2018 | Chang ................. H01L 29/0673 |

OTHER PUBLICATIONS

European Search Report, European Patent Application No. 17159054.0, dated Jul. 28, 2017, 10 pages.

* cited by examiner

INTERNAL SPACERS FOR NANOWIRE SEMICONDUCTOR DEVICES

CROSS-REFERENCE TO RELATED APPLICATIONS

The present application is a non-provisional patent application claiming priority to EP 17159054.0, filed on Mar. 3, 2017, the contents of which are hereby incorporated by reference.

FIELD OF THE DISCLOSURE

The disclosure relates to the field of nanowire semiconductor devices such as nanowire FETs. More specifically it relates to a method for forming an internal spacer between nanowires in a semiconductor device and to nanowire semiconductor devices comprising internal spacers. More specifically it relates to the formation of internal spacers for Gate All Around devices.

BACKGROUND

The formation of stacked nanowires is an important step for decreasing the feature sizes of semiconductor devices.

One important issue that needs to be tackled is reducing the parasitic capacitance due to overlap between the gate and source-drain region of a transistor.

In order to minimize this parasitic capacitance, the formation of an internal spacer has to be an integral part of the nanowire integration scheme.

Forming the internal spacer, however, can be process and/or material intensive. There is therefore room for improvement in the methods for forming the internal spacers.

SUMMARY

It is an object of embodiments of the present disclosure to provide a method of forming an internal spacer between nanowires in a semiconductor device.

The above objective is accomplished by a method and device according to the present disclosure.

In a first aspect, embodiments of the present disclosure relate to a method of forming an internal spacer between nanowires in a semiconductor device. The method involves providing at least one fin including a stack of layers of sacrificial material alternated with layers of nanowire material. The method also involves selectively removing part of the sacrificial material in between the nanowire material, thereby forming a recess in between the layers of nanowire material. The method further includes depositing dielectric material into the recess, which results in dielectric material within the recess and excess dielectric material outside the recess, where a crevice remains in the dielectric material in each recess. Yet further, the method involves removing the excess dielectric material using a first etchant. Thereafter, the method involves enlarging the crevices to form a gap using a second etchant, such that a remaining dielectric material still covers the sacrificial material and partly covers the nanowire material. And after enlarging the crevices, outer ends of the nanowire material are accessible. Additionally, the method involves growing electrode material on the outer ends of the nanowire material such that the electrode material growing from neighboring outer ends merges, thereby covering the gap, where the internal spacer comprises the gap.

In embodiments of the present disclosure, the second etchant is selected such that it penetrates into the crevice better than the first etchant.

When growing dielectric material in a recess, surfaces of the dielectric material that are growing from both sides of the recess grow until they touch each other or until the spacing between them at the surface of the dielectric material is smaller than 3 nm or even smaller than 1 nm or even smaller than 0.5 nm, or even smaller than 0.1 nm. This touching area or region with reduced spacing is referred to as a crevice. In embodiments of the present disclosure, a crevice is formed in the case of conformal deposition as well as in the case of non-conformal deposition. In the case of conformal deposition, the surfaces that are growing towards each other are touching over the complete length, but can still be penetrated by an etchant. In that case, the crevice in which the etchant can penetrate is referred to as a seam.

In embodiments of the present disclosure, an internal spacer with a low k-value can be formed. A low k-value can be obtained because the internal spacer includes a gap. This can for example be an air gap or a vacuum gap.

In embodiments of the present disclosure, the excess dielectric material can be removed using a first etch process without enlarging the crevice. Therefore, a first etch process that is used does not penetrate in the crevice as well as a second etch process that is used for enlarging the crevice. As such, not all of the dielectric material will be removed when removing the excess dielectric material (e.g., the dielectric material that is not in the recess made after removing part of the sacrificial in between the nanowire material).

In embodiments of the present disclosure, a second etch process is used for enlarging the crevices. This process can be selected such that it etches more efficiently in the crevice than the first etch process. This process enables an opening to be etched in the dielectric material while leaving dielectric material at the sidewalls against the nanowire material and at the bottom wall against the sacrificial material. Since the etching is done from within the crevice, dielectric material remains at the side walls against the nanowire material.

After enlarging the crevices, an electrode material (e.g. source or drain material) is grown on the outer ends of the nanowire material. Therefore, the electrode material can start to grow on the parts of the nanowire material from which the dielectric material is removed. It is thereby advantageous that not all dielectric material is removed from the side walls. The further away from the bottom the electrode material starts to grow, the larger the gap will be that is formed by the electrode material and the remaining dielectric material. Each internal spacer between the nanowires includes such a gap. This can be an air gap. In embodiments of the present disclosure, the volume of such a gap can be increased by using two different etch processes for removing the dielectric material. One for removing the excess dielectric material (e.g., the material outside the recesses and on the outer ends of the nanowire material), and one for enlarging the crevices.

In embodiments of the present disclosure, a dummy gate can partly cover the stack of layers of the provided fin. Additionally, the method involves providing a trench in the at least one fin by removing the sacrificial material and nanowire material next to the dummy gate, where the sacrificial material in between the nanowire material is selectively removed starting from the trench.

In embodiments of the present disclosure, depositing dielectric material can be done using conformal filling.

Additionally and/or alternatively, in embodiments of the present disclosure, depositing dielectric material can be done using non-conformal filling.

In embodiments of the present disclosure, a bubble can be present in the dielectric after non-conformal deposition thereof. This bubble can be accessed and widened using the second etch process by which the crevice is enlarged.

In embodiments of the present disclosure, providing at least one fin includes providing a fin where the nanowire material is Ge and the sacrificial layer material is $Si_{1-x}Ge_x$.

In embodiments of the present disclosure, providing at least one fin includes providing a fin wherein the Ge content in $Si_{1-x}Ge_x$ is lower than 80%.

In embodiments of the present disclosure, a minimal difference can exist between the sacrificial material and the nanowire material. This difference can enable selective etching.

In embodiments of the present disclosure, providing at least one fin includes providing a fin where the nanowire material is Si and the sacrificial layer material is $Si_{1-x}Ge_x$.

In embodiments of the present disclosure, providing at least one fin includes providing a fin wherein the Ge content in $Si_{1-x}Ge_x$ is up to 50%.

In embodiments of the present disclosure, lowering the Ge content can increase the bias.

In embodiments of the present disclosure, depositing dielectric material includes depositing a nitride.

In embodiments of the present disclosure, depositing dielectric material includes depositing an oxide.

In a second aspect, embodiments of the present disclosure relate to a stack of nanowire transistors. Each nanowire transistor includes a nanowire, a source or a drain at an extremity of the nanowire, a control gate, and an internal spacer in between the nanowires of neighboring transistors and between the source or the drain and the gate. The internal spacer includes an air gap and dielectric material, where the dielectric material can be present between the gate and the air gap and/or between the nanowire and the air gap, and where the dielectric material can have a thickness smaller than 3 nm, and where the source or drain material is epitaxially grown from extremities of the nanowire material forming a bridge between the nanowires, thereby closing the air gap.

In embodiments of the present disclosure, the internal spacers of the nanowire transistors can include an air gap. Such an air gap can help achieve an internal spacer with a low k-value. In embodiments of the present disclosure, no dielectric material can be present on the source or drain material at the side of the air gap since the source or drain material is epitaxially grown from extremities of the nanowire material forming a bridge between the nanowires to close the air gap. As no dielectric is present on the source or drain material at the side of the air gap the size of the air gap is larger than in case the dielectric material would be present. The larger the gap, the lower the k-value of the internal spacer.

In embodiments of the present disclosure, the nanowires include Ge.

In embodiments of the present disclosure, the nanowires include Si.

Particular and preferred aspects of the disclosure are set out in the accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter.

Figure 1:
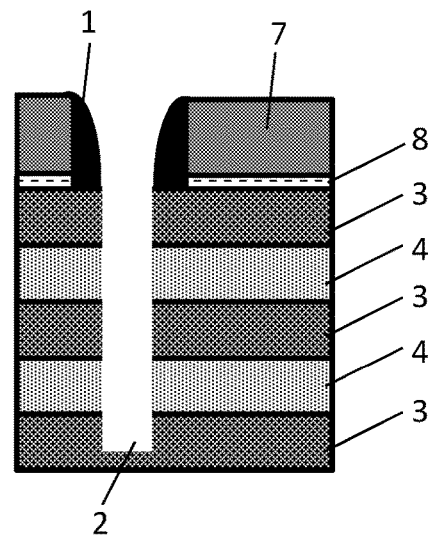
FIG. 1 shows a schematic drawing of a longitudinal cross-section of a fin which is obtained after providing a trench in the fin, in accordance with embodiments of the present disclosure.

Any reference signs in the claims shall not be construed as limiting the scope. In the different drawings, the same reference signs refer to the same or analogous elements.

DETAILED DESCRIPTION

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Where in embodiments of the present disclosure reference is made to the nanowire material, reference is made to material from which the nanowires are made.

In a first aspect, embodiments of the present disclosure relate to a method 100 of forming an internal spacer between nanowires in a semiconductor device.

Figure 8:
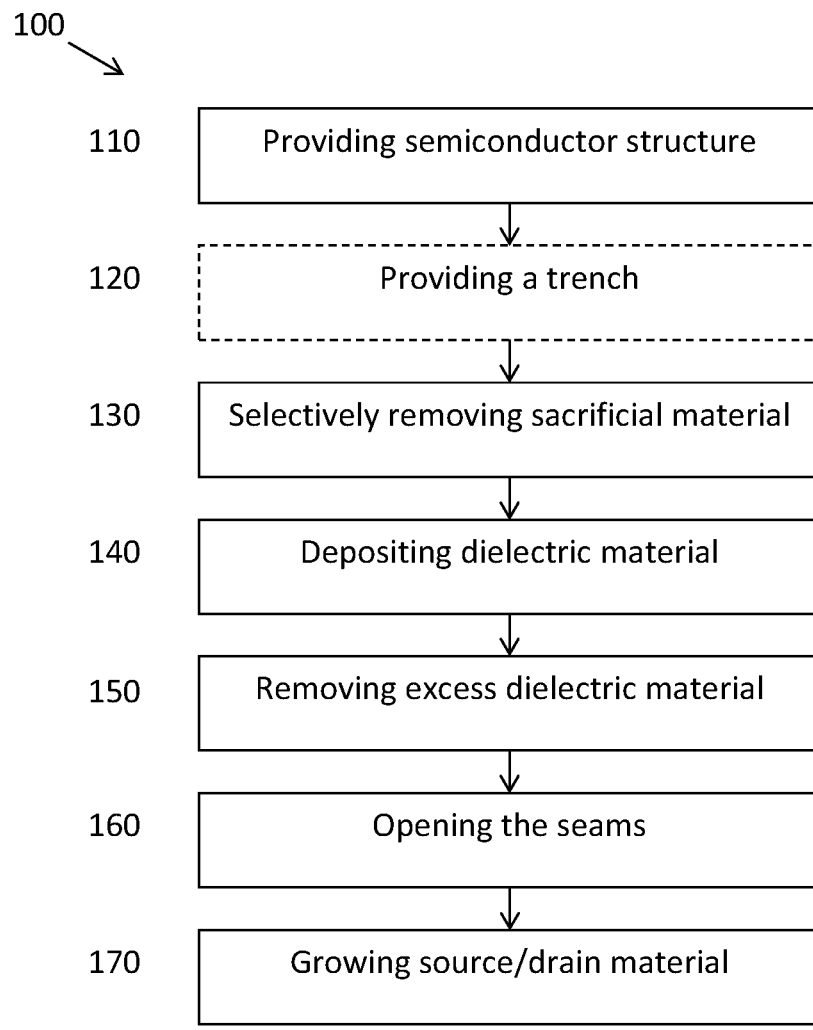
FIG. 8 shows the flow chart of a method, in accordance with embodiments of the present disclosure.

As shown in FIG. 8, the method 100 involves step 110 of providing at least one fin including a stack of layers of sacrificial material 4 alternated with layers of nanowire material 3. In embodiments of the present disclosure, a dummy gate 7 may be partly covering the stack of layers of the at least one fin.

FIG. 1 shows a schematic drawing of a longitudinal cross-section of a fin that is obtained after performing step 120 of providing a trench in the fin. The fin includes an alternating stack of layers of sacrificial material 4 and layers of nanowire material 3. In this example, a dummy gate 7 is partly covering the stack of layers of the at least one fin.

Between the dummy gate 7 and the stack of layers of the fin a dummy dielectric 8 is present. Next to the dummy gate 7, a dummy spacer 1 is present. In this fin, a trench 2 is formed in the fin next to the dummy spacer 1. This trench can be orthogonal to the layers of nanowire material.

Figure 2:
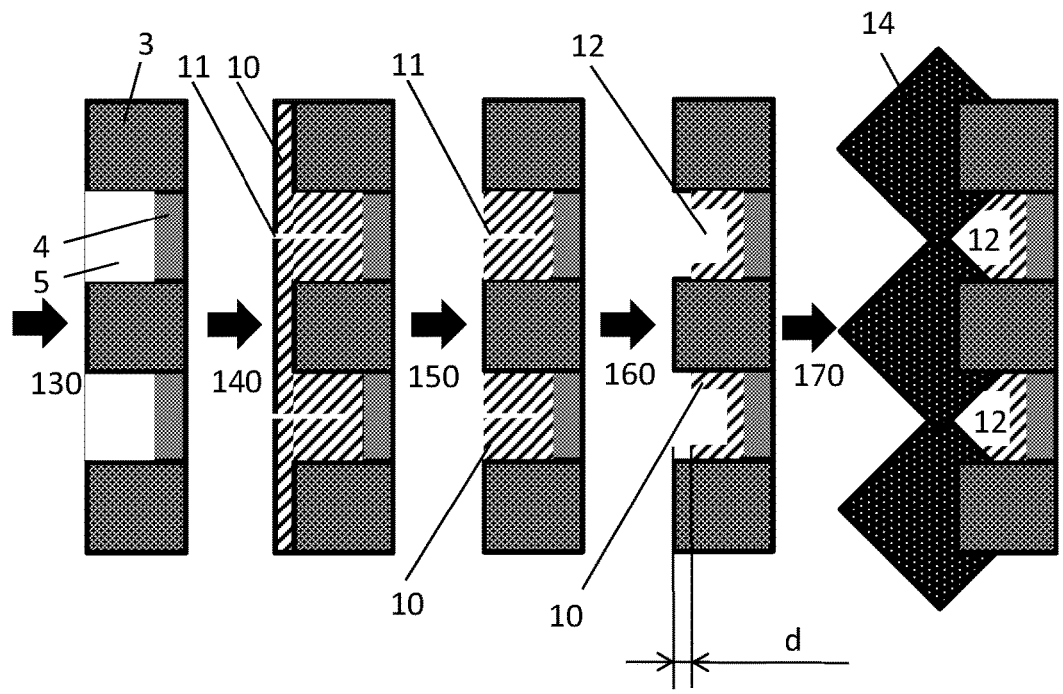
FIG. 2 schematically illustrates the steps of a method, in according with embodiments of the present disclosure.

The steps of a method in accordance with embodiments of the present disclosure are explained below and are illustrated by the schematic drawings illustrated in FIG. 2. A flow chart of these steps is shown in FIG. 8.

The method involves step 130 of selectively removing part of the sacrificial material 4 in between the nanowire material 3 next to the dummy gate 7, thereby forming a recess 5 in between the layers of nanowire material 3.

Selective removal 130 of the sacrificial material can be done after step 120 of providing a trench 2 in the at least one fin by removing the sacrificial material 4 and nanowire material 3 next to the dummy gate 7.

In embodiments of the present disclosure, the sacrificial material 4 in between the nanowire material is selectively removed starting from the trench 2.

After making the recesses 5 in between the layers of nanowire material 3, the method involves step 140 of depositing dielectric material 10 into the recesses 5, which are created by selectively removing the sacrificial layer material. This results in dielectric material within the recesses 5 and excess dielectric material outside the recesses 5 and on outer ends of the nanowire material 3. A crevice 11 can remain in the dielectric material at the height of each recess 5. This crevice (e.g. seam) 11 is formed in between the nanowires when the dielectric material is deposited.

Deposition of dielectric material 10 can be done using conformal deposition. During the deposition, the surface of the dielectric material 10 can grow from both sides until the recess is filled. A silicon oxide may for example be deposited using plasma-enhanced atomic layer deposition (PEALD).

Figure 3:
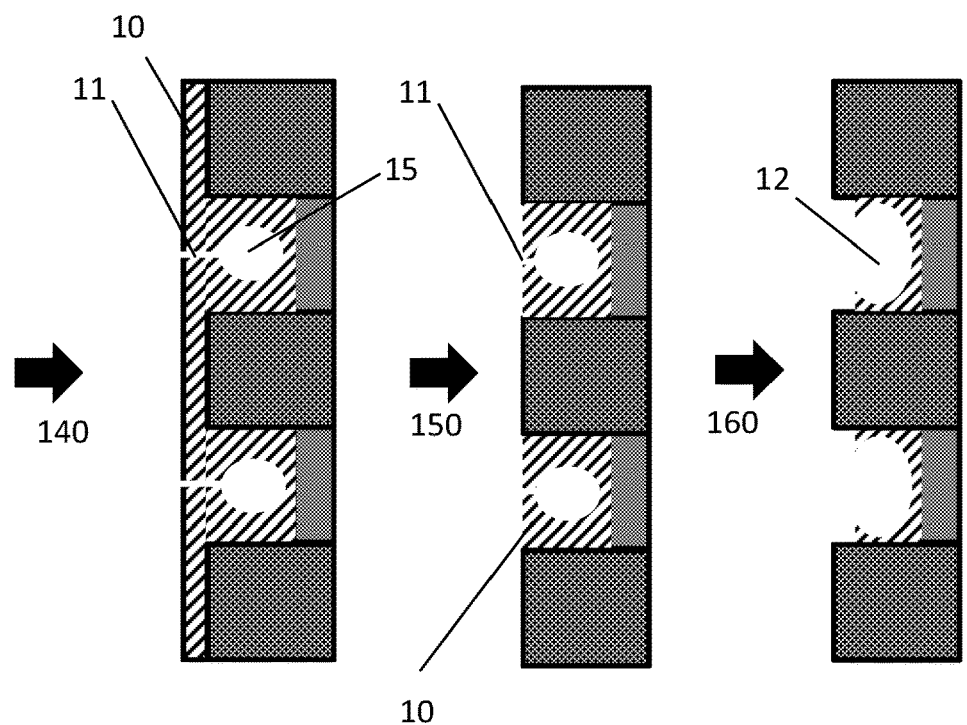
FIG. 3 shows a schematic drawing of a stack of nanowires with recesses in between the layers of nanowire material and with dielectric material deposited by non-conformal deposition in these recesses, where a droplet shaped air gap is present in the dielectric.

Deposition of the dielectric material 10 can also be done using non-conformal deposition. After depositing the dielectric material using non-conformal deposition, a bubble 15 (droplet shaped volume) may remain present in the dielectric material in the recess 5. An example thereof is shown in the schematic drawing of FIG. 3. The size and form of the bubbles may be controlled by controlling the deposition characteristics and by controlling the aspect ratio of the recess 5. Non-conformal deposition may for example be done using chemical vapor deposition (CVD) or using plasma-enhanced chemical vapor deposition. After performing step 150 of removing the excess dielectric material using a first etchant, the crevices 11 and the bubble 15 can be enlarged to form the gap 12.

In embodiments of the present disclosure, the dielectric may for example be a nitride or an oxide. For example, a silicon nitride or a silicon oxide can be deposited. Other examples of dielectric materials that can be deposited include silicon carbon oxide (SiCO) and SiN. Non-conformal deposition of an oxide can be done using flowable chemical vapor deposition (FCVD).

In embodiments of the present disclosure, the excess dielectric material can removed using a first etch process. In embodiments of the present disclosure, the first etch process can be selected such that it does not, or does not easily, penetrate the seal. The first etch process may for example be a gas-phase $NF_3/NH_3$-based chemical etching. This type of etching can be used in the case of silicon oxide etching as well as in the case of silicon nitride etching. An example of such a gas-phase $NF_3/NH_3$-based etch process can for example be AMAT (Applied Materials) SiConi™. SiConi™ is a plasma assisted dry etch process. Different recipes can be used depending on the dielectric material that needs to be etched. Also TEL (Tokyo Electron Limited) and SCREEN (SCREEN semiconductor solutions Co., Ltd.) now have similar systems available. Gas-phase $NF_3/NH_3$-based chemical etching is described in "Advanced in situ pre-Ni silicide (Siconi) cleaning at 65 nm to resolve defects in $NiSi_x$ modules" by Yang et al, and published on 7 Jan. 2010 by American Vacuum Society (Journal of Vacuum Science & Technology B, Nanotechnology and Microelectronics: Materials, Processing, Measurement, and Phenomena 28, 56 (2010); doi: 10.1116/1.3271334). This article is included here by reference. In embodiments of the present disclosure, the first etch can for example also be done using some F-containing isotropic plasma.

After removing the excess dielectric material, the crevices (e.g. seams) 11 are enlarged to form a gap 12. This can be done using a second etch process. In embodiments of the present disclosure, the second etch process can be selected such that it penetrates better into the crevice (e.g. seam) 11 than the first etch process.

When the dielectric material is a silicon oxide, the second etch process can be a wet oxide etch. It may for example include HF, which can easily penetrate into the crevice 11 (compared to the first etch process). Also BHF solutions could be used as the second etchant.

When the dielectric material is a nitride, the second etch process may for example include phosphoric acid or it may for example include an aqueous HF solution.

Figure 4:
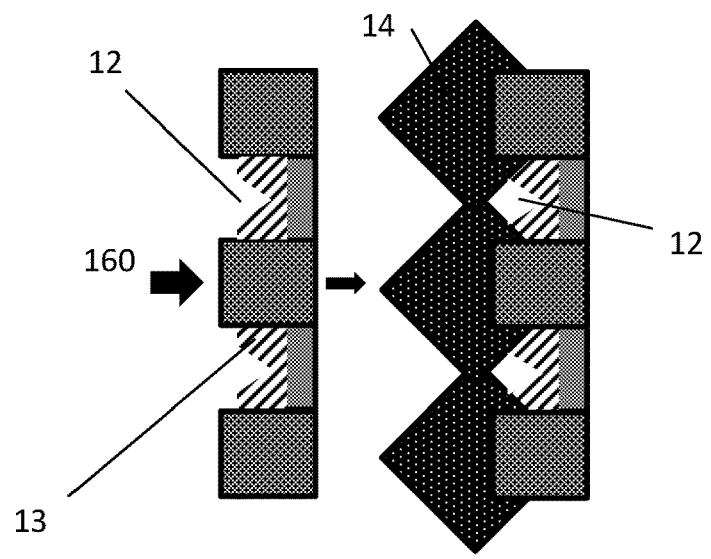
FIG. 4 shows the formation of gap using a method, where the first etch process is the same as the second etch process, in accordance with embodiments of the present disclosure.

In embodiments of the present disclosure, the first etch process can be the same as the second etch process. The first and the second etch processes may for example be a gas-phase $NF_3/NH_3$ etch (e.g. SICONI). In that case, the gap 12 that is formed may have a V-shaped cross-section as illustrated in FIG. 4. In that case, excess dielectric can be present in the corners next to the sacrificial wire. This illustrates that having a second etchant that penetrates better into the crevice than the first etchant is advantageous because a gap 12 with a larger volume can be created.

After enlarging the crevice, a gap 12 is created. This gap 12 can be created completely by the second etch process, or a droplet shaped air gap might already have been present in the dielectric after the deposition of the dielectric. A droplet shaped air gap that is present in the dielectric can be opened up by enlarging the crevice. Such a droplet shaped air gap may be present after non-conformal deposition of the dielectric material. Such a bubble may be opened by enlarging the crevice at the top of the bubble.

Although the crevice in enlarged, some dielectric material should remain. The second etch process is controlled such that the remaining dielectric material still covers the sacrificial material and partly covers the nanowire material. The gap should be as wide as possible because this results in a low k-value. The remaining dielectric material should be as thin as possible. The thickness should be sufficient such that the oxide survives the RMG (replacement metal gate) process. The dielectric material ensures that nanowires can be released in the RMG module with high selectivity between the nanowire material and sacrificial layer.

In embodiments of the present disclosure, the presence of a crevice (e.g. a seam) in the dielectric material can be exploited by using two different etchback steps. A first step 150 in which the excess dielectric material is removed, and a second step 160 in which the crevice is enlarged. In the second step, an etchant can be used that penetrates more easily into the crevice than the etchant used in the first step. A larger gap can be created by using these different etchants. By using the first etchant, complete removal of the dielectric is prevented in the first step. By using the second etchant, the dielectric in the recess can be removed starting from within the crevice.

After the first etch process and the second etch process, the outer ends of the nanowire material are freed of the dielectric material. Hence they are accessible for growing source or drain material on the outer ends of the nanowire material 3 such that the source or drain material growing from neighboring outer ends merge. Therefore, the gap 12 is closed with on one side the drain or source material and on the other side with the remaining dielectric. The internal spacer includes the gap 12 and the remaining dielectric material.

Figure 5:
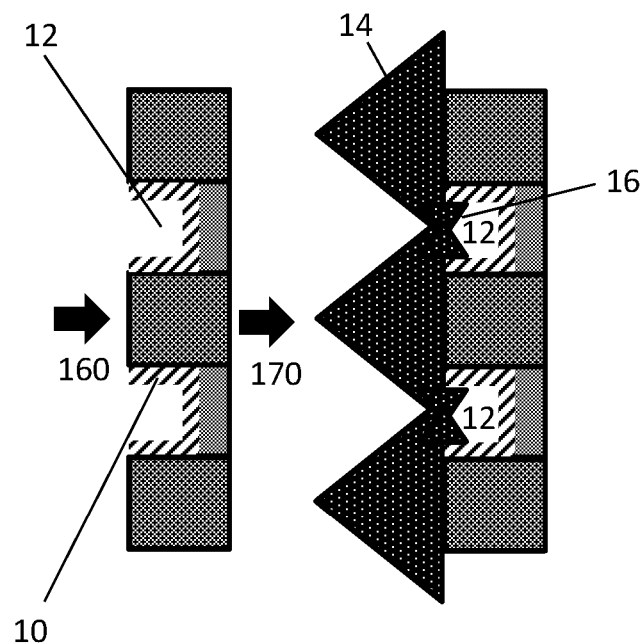
FIG. 5 illustrates the EPI growth on a nanowire of which only the top part is freed from dielectric material, in accordance with embodiments of the present disclosure.

In embodiments of the present disclosure, the outer end of the nanowire material, which is freed of the dielectric material, includes a portion of the sidewalls. This is illustrated in FIG. 2 where the recess distance d indicates how much of the sidewalls of the nanowire material is freed. In other embodiments of the present disclosure, the outer end of the nanowire material that is freed of the dielectric material only includes the top of the nanowire material. An example thereof is given in FIG. 5. In both examples, it is illustrated that the EPI is only growing from the exposed nanowire surface. The dielectric recess d will therefore determine the source/drain shape. The growth may for example be a diamond growth when d is different from zero (as is illustrated in FIG. 2) or the growth may be a pyramid growth when no dielectric recess is present (as is illustrated in FIG. 5). As is illustrated in FIG. 5, a pyramid growth may result in a reduced air gap and an increased amount of defects in the EPI compared with a diamond growth. It is therefore advantageous to have a recess d which is different from zero. Preferably the recess is such that the EPI growth is a diamond growth.

In embodiments of the present disclosure, the source or drain material is epitaxially growing from the outer ends of the nanowire material in a faceted way (e.g. diamond fashion). The EPI is grown from neighboring outer ends and merges. This allows formation of a bridge between two nanowires 3, leaving an air gap internal spacer. The air gap may for example be closed by the anisotropic growth of an epitaxial S/D, e.g. SiGe or Si:P.

In embodiments of the present disclosure, after enlarging the crevice, at least some oxide material remains in the corners, the bottom, and on at least part of the side walls of the nanowires. The S/D is grown from the outer ends of the nanowire material. As some oxide material remains in the corners and on at least part of the side walls of the nanowire material, the S/D is grown mostly from the top of the nanowire. Thus, larger air gap internal spacers can be achieved. Indeed, if no dielectric material is present in the corner, the S/D would start growing from the corner resulting in a smaller air gap, or even completely lack of an air gap.

In embodiments of the present disclosure, after growing the source or drain material, the nanowires are released and the dummy gate is replaced by a real gate.

The step 130 of selective removal of part of the sacrificial material 4 in between the nanowire material 3 can be isotropic or anisotropic.

Anisotropic etching can result in a skewed shape of the internal spacer/gate interface. The skewed shape is a result of the anisotropic etching where the sacrificial material is not etched along a straight surface but where a skewed shaped surface is formed.

Isotropic selective etching can result in a straight profile of the internal spacer/gate interface and hence a better defined crevice after the deposition of the dielectric material. For example, after conformal deposition of the dielectric material, a crevice 11 can remain and can extend in the dielectric material 10 deep into the recess 5. The reason is that the surface of the sacrificial material, after selective removal 130 using isotropic etching, is a flat surface. Hence, the conformal deposition of the dielectric starts from a flat surface resulting in a well-defined seam.

In a second aspect, embodiments of the present disclosure relate to a stack of nanowire transistors. Each nanowire transistor includes a nanowire 3, a source or drain 14 at an end of the nanowire 3 (e.g. a source at one end of the nanowire and a drain at the opposite end of the nanowire), a gate 37, and an internal spacer in between the nanowires 3 and between the source or drain 14 and the gate 37. The internal spacer includes an air gap 12 and dielectric material (10) where the dielectric material (10) is present between the gate (37) and the air gap (12) and/or between the nanowire (3) and the air gap (12), and where the dielectric material (10) has a thickness smaller than 3 nm or even smaller than 2 nm or even smaller than 1 nm. The smaller the thickness of the dielectric, the larger the gap and hence the lower the k-value of the internal spacer.

The thickness of the dielectric should be thick enough to stop selective etching during nanowire release. In the case that Si nanowires are considered and HCl (g) is used as selective etch process, 1 nm of dielectric (e.g. oxide or nitride) may be sufficient to stop the selective etch process as HCl (g) is very selective towards the dielectric (e.g. oxide or nitride). Also, in the case that an alkaline solution is used for the selective etch/nanowire release, 1 nm of dielectric (e.g. oxide) may be sufficient for the release of SiGe nanowires. In the case of Ge nanowires, it may be required to have a dielectric with a larger thickness as the selective etchant will have a more limited selectivity towards the dielectric (e.g. oxide). In that case, maybe 2 nm (or more) should remain after enlarging the crevices using the second etchant.

The size of the air gap 12 (the largest dimension) may, for example, be between 3-15 nm or even between 5-10 nm. The height of the air gap may, for example, be between 5 and 15 nm (e.g. 12 nm). The width of the air gap may, for example, be between 5 and 10 nm (e.g. 6 nm). In embodiments of the present disclosure, the cross-section of the nanowire is not necessarily circular. It may, for example, also be rectangular (e.g. sheet like shape of the nanowire). In that case, the width of the air gap may be larger. It may be up to 20 nm, or even up to 30 nm, or even up to 40 nm. It may, for example, be 12 nm. In embodiments of the present disclosure, the depth of the air gap, i.e. the dimension in the direction from S/D to gate, may, for example, be between 5 and 10 nm or even between 3-15 nm.

Figure 6:
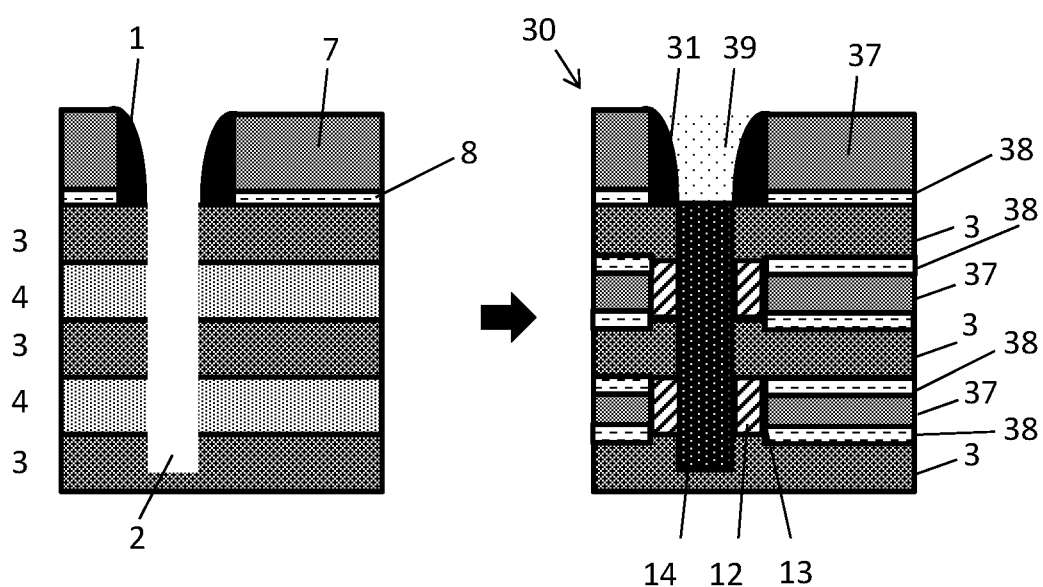
FIG. 6 shows a schematic drawing of a stack of nanowire materials, where the top layer of the alternating stack of layers is a layer of nanowire material, in accordance with embodiments of the present disclosure.
Figure 7:
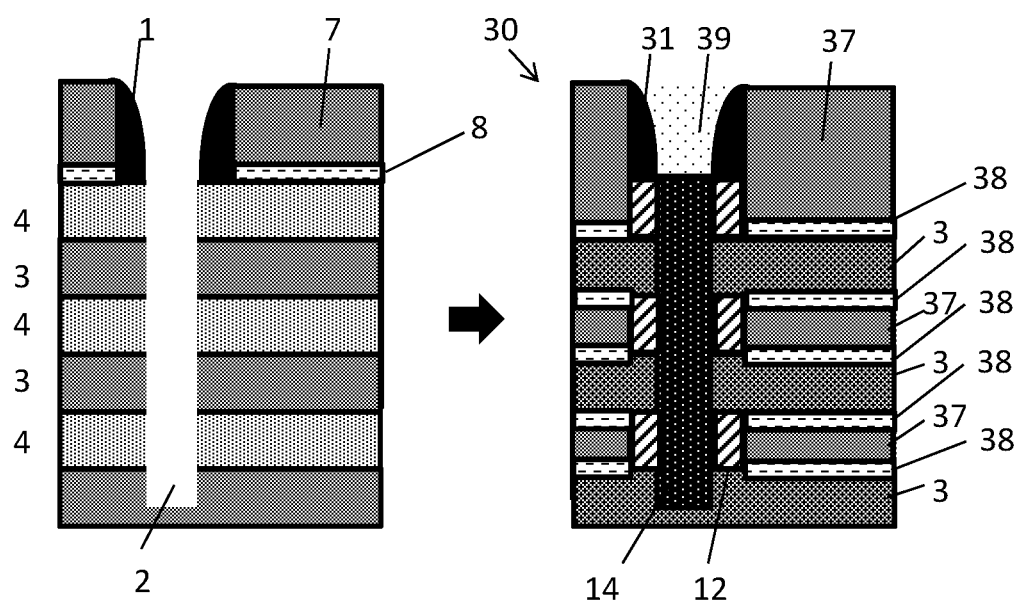
FIG. 7 shows a schematic drawing of a stack of nanowire materials, where the top layer of the alternating stack of layers is a layer of sacrificial material, in accordance with embodiments of the present disclosure.

Two exemplary embodiments of such a stack of nanowire transistors are shown in FIG. 6 and FIG. 7. These figures show on the left side the original fin comprising a stack of layers of sacrificial material 4 alternated with layers of nanowire material 3. And on the right side, the figures show the stack of nanowire transistors where the internal spacers of the nanowire transistors include an air gap 12.

In FIG. 6, the top layer of the alternating stack of layers is a layer of nanowire material 3. In FIG. 7, this layer is a layer of sacrificial material 4. In both left drawings of FIG. 6 and FIG. 7, a dummy gate 7 is partly covering the stack of layers of the fin. Between the dummy gate 7 and the stack of layers of the fin, a dummy dielectric 8 is present. Next to the dummy gate 7, a dummy spacer 1 is present.

In the stack of nanowire transistors 30, each nanowire transistor comprises a nanowire 3, an electrode source or a drain 14, a gate 37, and an internal spacer comprising an air gap 12. The dummy gate 7 and the sacrificial material layers 4, in the left drawings, are replaced by the gate 37. In between the gate 37 and the nanowire 3, a dielectric 38 is present. Also, the source/drain 14 is present at the outer ends of the nanowires 3. At the top of the fin, a spacer 31 is present next to the gate 37 and an interlayer dielectric (ILD0) 39 is present next to the spacer. The internal spacer is present between the nanowires 3 of neighboring transistors and between the S/D 14 and the gate 37.

In FIG. 6, the top layer is made from nanowire material 3 and therefore the dummy spacer 1, in this example, can determine the gate length of the top nanowire. The length of the other nanowires, in this example, can be determined by the internal spacer (e.g., the gap 12).

In FIG. 7, the top layer is made from sacrificial material 4 and therefore the internal spacer (e.g., the gap 12) can determine the gate length of all nanowires 3.

In embodiments of the present disclosure, the nanowire material may for example include Si, or Ge, or SiGe, a III-V compound material. Such a III-V compound material can be binary such as GaAs or GaP, or it can be ternary such InGaAs.

In embodiments of the present disclosure, the nanowire material can be Si and the sacrificial layer material can be $Si_{1-x}Ge_x$. The Ge content in $Si_{1-x}Ge_x$ can be between 20% and 50% and can be up to 50%.

In embodiments of the present disclosure, the nanowire material is Ge and the sacrificial layer material is $Si_{1-x}Ge_x$. The Ge content in $Si_{1-x}Ge_x$ can be below 80%, for example between 50% and 75%. This difference is required to enable selective etching.

What is claimed is:

1. A method of forming an internal spacer between nanowires in a semiconductor device, the method comprising:
   providing at least one fin comprising a stack of layers of sacrificial material alternated with layers of nanowire material;
   selectively removing part of the sacrificial material in between the nanowire material, thereby forming a plurality of recesses in between the layers of nanowire material;
   depositing dielectric material into each recess resulting in a dielectric material within the recess and an excess dielectric material outside the recess, wherein a crevice remains in the dielectric material within each recess;
   removing the excess dielectric material using a first etchant;
   forming a gap by enlarging the crevices using a second etchant such that a remaining dielectric material still covers the sacrificial material and at least partly covers the nanowire material, wherein after forming the gap, outer ends of the nanowire are accessible; and
   growing electrode material on the outer ends of the nanowire material such that the electrode material growing from neighboring outer ends merge to cover the gap, wherein the internal spacer comprises the gap.

2. The method of claim 1, wherein the second etchant is selected such that it penetrates into the crevice better than the first etchant.

3. The method of claim 1, wherein a dummy gate partly covers the stack of layers of the provided fin, and wherein the method further comprises:

providing a trench in the at least one fin by removing the sacrificial material and the nanowire material next to the dummy gate.

4. The method of claim 3, wherein the sacrificial material in between the nanowire material is selectively removed starting from the trench.

5. The method of claim 3, wherein a dummy dielectric is present between the dummy gate and the stack of layers of the at least one fin.

6. The method of claim 1, wherein the outer ends of the nanowire material comprise a portion of sidewalls of the nanowire material, and wherein a recess distance d indicates how much of the sidewalls of the nanowire material are included in the outer ends.

7. The method of claim 6, wherein the growing of the electrode material is diamond growth.

8. The method of claim 1, wherein depositing dielectric material is done using conformal filling.

9. The method of claim 1, wherein depositing dielectric material is done using non-conformal filling.

10. The method of claim 1, wherein providing at least one fin comprises providing a fin where the nanowire material is Ge and the sacrificial layer material is $Si_{1-x}Ge_x$.

11. The method of claim 10, wherein the Ge content in $Si_{1-x}Ge_x$ is lower than 80%.

12. The method of claim 1, wherein providing at least one fin comprises providing a fin where the nanowire material is Si and the sacrificial material is $Si_{1-x}Ge_x$.

13. The method of claim 12, wherein the Ge content in $Si_{1-x}Ge_x$ is up to 50%.

14. The method of claim 1, wherein depositing dielectric material comprises depositing a nitride.

15. The method of claim 1, wherein depositing dielectric material comprises depositing an oxide.

16. The method of claim 1, wherein the selective removal of the part of the sacrificial material is isotropic.

17. The method of claim 1, wherein the gap is one of: an air gap or a vacuum.

* * * * *